(12) United States Patent
Huang et al.

(10) Patent No.: US 8,466,064 B2
(45) Date of Patent: Jun. 18, 2013

(54) SEMICONDUCTOR INTEGRATED CIRCUIT DEVICE AND METHOD OF MANUFACTURING A SEMICONDUCTOR INTEGRATED CIRCUIT DEVICE

(75) Inventors: Yu-Fong Huang, Tainan (TW); Tzung-Ting Han, Yilan (TW); Wen-Pin Lu, Chupei (TW)

(73) Assignee: Macronix International Co., Ltd. (TW)

( * ) Notice: Subject to any disclaimer, the term of this patent is extended or adjusted under 35 U.S.C. 154(b) by 194 days.

(21) Appl. No.: 12/945,659

(22) Filed: Nov. 12, 2010

(65) Prior Publication Data

US 2012/0119282 A1    May 17, 2012

(51) Int. Cl.
*H01L 21/44* (2006.01)

(52) U.S. Cl.
USPC ........... 438/682; 438/649; 438/651; 438/755; 257/E21.006; 257/E21.027; 257/E21.043; 257/E21.058; 257/E21.17; 257/E21.231; 257/E21.248; 257/E21.165; 257/E21.267

(58) Field of Classification Search
USPC ................ 438/682, 651, 954, 649, 755, 238, 438/769, 663, 514, 700, 680, 775; 257/E21.006, 257/E21.231, E21.027, E21.043, E21.058, 257/E21.165, E21.17, E21.248, E21, 267, 257/E21.593, E21.645
See application file for complete search history.

(56) References Cited

U.S. PATENT DOCUMENTS

| | | | |
|---|---|---|---|
| 6,548,425 B2 | 4/2003 | Chang et al. | |
| 6,808,991 B1 * | 10/2004 | Tung | 438/275 |
| 7,688,626 B2 | 3/2010 | Lue et al. | |
| 2007/0108520 A1 | 5/2007 | Lin et al. | |
| 2008/0026527 A1 | 1/2008 | Chen et al. | |
| 2008/0099427 A1 | 5/2008 | Luoh et al. | |
| 2008/0315308 A1 | 12/2008 | Huang et al. | |
| 2009/0191705 A1 * | 7/2009 | Liu et al. | 438/653 |
| 2009/0256183 A1 | 10/2009 | Lin et al. | |
| 2009/0256184 A1 | 10/2009 | Lin et al. | |

* cited by examiner

*Primary Examiner* — David Nhu
(74) *Attorney, Agent, or Firm* — Baker & McKenzie LLP

(57) ABSTRACT

A system, method, and layout for a semiconductor integrated circuit device allows for improved scaling down of various back-end structures, which can include contacts and other metal interconnection structures. The resulting structures can include a semiconductor substrate, a buried diffusion region formed on the semiconductor substrate, and at least one of a silicide film, for example tungsten silicide ($WSi_x$), and a self-aligned silicide (salicide) film, for example cobalt silicide (CoSi) and/or nickel silicide (NiSi), above the buried diffusion (BD) layer. The semiconductor integrated circuit can also include a memory gate structure formed over at least a portion of the contact layer.

18 Claims, 13 Drawing Sheets

SEMICONDUCTOR INTEGRATED CIRCUIT DEVICE AND METHOD OF MANUFACTURING A SEMICONDUCTOR INTEGRATED CIRCUIT DEVICE

BACKGROUND

1. Technical Field

The present application relates to processes for forming integrated circuit devices and, more particularly, to processes for forming integrated circuit devices having a memory array.

2. Related Art

In the semiconductor industry, there is a continuing trend toward higher device densities. To achieve these high densities, there has been and continues to be efforts toward scaling down device dimensions at submicron levels on semiconductor wafers. However, there are many problems that result from scaling down such circuitry.

Semiconductor manufacturing includes front-end processing, which includes processes for forming transistors on a wafer. For example, the front-end processing can include processes for forming vertical channels. Various processes have been successful in reducing the pitch of such structures, allowing for scaling down the structures formed during front-end processing.

Semiconductor manufacturing also includes a back-end processing of wafer fabrication. The back-end processing is also referred to as back end of line (BEOL), and usually includes creating metal interconnects for interconnecting transistors formed during the front-end processing. The back-end processing can also include formation of insulating structures between the metal interconnects.

While various processes have been successful in scaling down the structures formed during front-end processing, such processes have not been as successful for scaling down the structures formed during back-end processing. For example, while processes are known for successfully scaling down the pitch of vertical channels formed during front-end processing, such processes are not as useful for scaling down of the back-end pitch of contact and metal structures. Thus, the inability to scale down back-end structures limits the overall ability to scale down an integrated circuit device.

This may include the width and spacing of interconnecting lines and the surface geometry such as corners and edges of various features.

Thus, it is desirable to find new approaches for the manufacturing of integrated circuits in order to allow for desired scaling, particularly of metal and contact structures formed during back-end processing.

SUMMARY

Disclosed herein is a system, layout, and method for manufacturing a semiconductor integrated circuit device that allows for improved scaling down of various back-end structures, which can include contacts and other metal interconnection structures. The resulting structures can include at least one of a silicide film, for example tungsten silicide ($WSi_x$) and a self-aligned silicide (salicide) film, for example cobalt silicide (CoSi) and/or nickel silicide (NiSi), above a buried diffusion (BD) layer. Such structures allow for various improvements in semiconductor devices, including, for example, semiconductor memory devices. For example, the disclosed system and method allows for the reduction of the sheet resistance (Rs) of bit line structures in semiconductor memory devices without the use of contact strapping, which has previously been used to avoid bit line loading. Instead, the contact can be connected directly to the end of a bit line, and back-end pitch relaxation and a small memory array can be achieved.

According to some embodiments, a semiconductor integrated circuit can comprise a semiconductor substrate, a first buried diffusion region above the semiconductor substrate, and a first contact layer above the first buried diffusion region. The first contact layer can comprise at least one of silicide material and salicide material. The semiconductor integrated circuit can also comprise a memory gate structure formed over at least a portion of the first contact layer.

In some embodiments, the first contact layer can comprise silicide material, which can include, for example, tungsten.

In some embodiments, the first contact layer can comprise salicide material, which can include, for example, cobalt or nickel.

In some embodiments, the semiconductor integrated circuit can further include a charge storage layer, for example including an oxide-nitride-oxide (ONO) layer, formed over at least a portion of the first contact layer.

In some embodiments, the first contact layer can be connected to a bit line via a vertical contact structure.

In some embodiments, the semiconductor integrated circuit can further comprise a second buried diffusion region and a charge storage layer. The charge storage layer can extend between the first and second buried diffusion regions. In some such embodiments, the semiconductor integrated circuit can further comprise a second contact layer above the second buried diffusion region. In some such embodiments, the charge storage layer can extend between the first and second contact layers. Also, the second contact layer can comprise a salicide material, which can include, for example, cobalt or nickel.

According to another aspect of the present disclosure, a method for forming a semiconductor integrated circuit can comprise forming a first buried diffusion region over a semiconductor substrate, and forming a first contact layer above the first buried diffusion region. The first contact layer can comprise at least one of silicide material and salicide material. The method can further comprise forming a memory gate structure over at least a portion of the first contact layer.

In some embodiments, the first contact layer can comprise silicide material, which can include, for example, tungsten.

In some embodiments, the first contact layer can comprise salicide material, which can include, for example, cobalt or nickel.

In some embodiments, the method can further comprise forming a charge storage layer, for example including an oxide-nitride-oxide (ONO) layer, formed over at least a portion of the first contact layer.

In some embodiments, the method can further comprise forming a vertical contact structure connected to the first contact layer, and forming a bit line connected to the first contact layer via the vertical contact structure.

In some embodiments, the method can further comprise forming a second buried diffusion region and forming a charge storage layer, wherein the charge storage layer extends between the first and second buried diffusion regions. In some such embodiments, the method can further comprise forming a second contact layer above the second buried diffusion region. In some such embodiments, the charge storage layer can extend between the first and second contact layers. Also, the second contact layer can comprise a salicide material, which can include, for example, cobalt or nickel.

According to another aspect of the present disclosure, a layout of a semiconductor memory device can comprise a first plurality of bit lines extending in a first direction, and a second plurality of bit lines extending at least substantially parallel to the first direction. The second plurality of bit lines can include bit lines that are positioned between bit lines of the first plurality of bit lines. The layout can also comprise a first plurality of buried diffusion regions extending at least substantially parallel to the first direction, and a first plurality of contact layers above respective ones of the first plurality of buried diffusion regions. The contact layers of the first plurality of contact layers can comprise at least one of silicide material and salicide material. The layout can further comprise a plurality of memory gate structures extending in a second direction at least substantially perpendicular to the first direction. The plurality of memory gate structures can be formed over at least portions of the contact layers of the first plurality of contact layers.

In some embodiments, contact layers of the first plurality of contact layers can comprise silicide material, which can include, for example, tungsten.

In some embodiments, contact layers of the first plurality of contact layers can comprise salicide material, which can include, for example, cobalt or nickel.

In some embodiments, the layout can further comprise a charge storage layer, for example including an oxide-nitride-oxide (ONO) layer, formed over at least a portion of contact layers of the first plurality of contact layers.

In some embodiments, contact layers of the first plurality of contact layers can be connected to respective ones of the first plurality of bit lines via respective vertical contact structures.

In some embodiments, the layout can further comprise a second plurality of buried diffusion regions extending at least substantially parallel to the first direction, and a plurality of charge storage layers. The charge storage layers can extend between respective ones of the first plurality of buried diffusion regions and respective ones of the second plurality of buried diffusion regions.

In some embodiments, the layout can further comprise a second plurality of contact layers above respective ones of the second plurality of buried diffusion regions. In some such embodiments, charge storage layers of the plurality of charge storage layers can extend between the respective ones of the first plurality of contact layers and respective ones of the second plurality of contact layers. Also, contact layers of the second plurality of contact layers can comprise a salicide material, which can include, for example, cobalt or nickel.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

Figure 1:
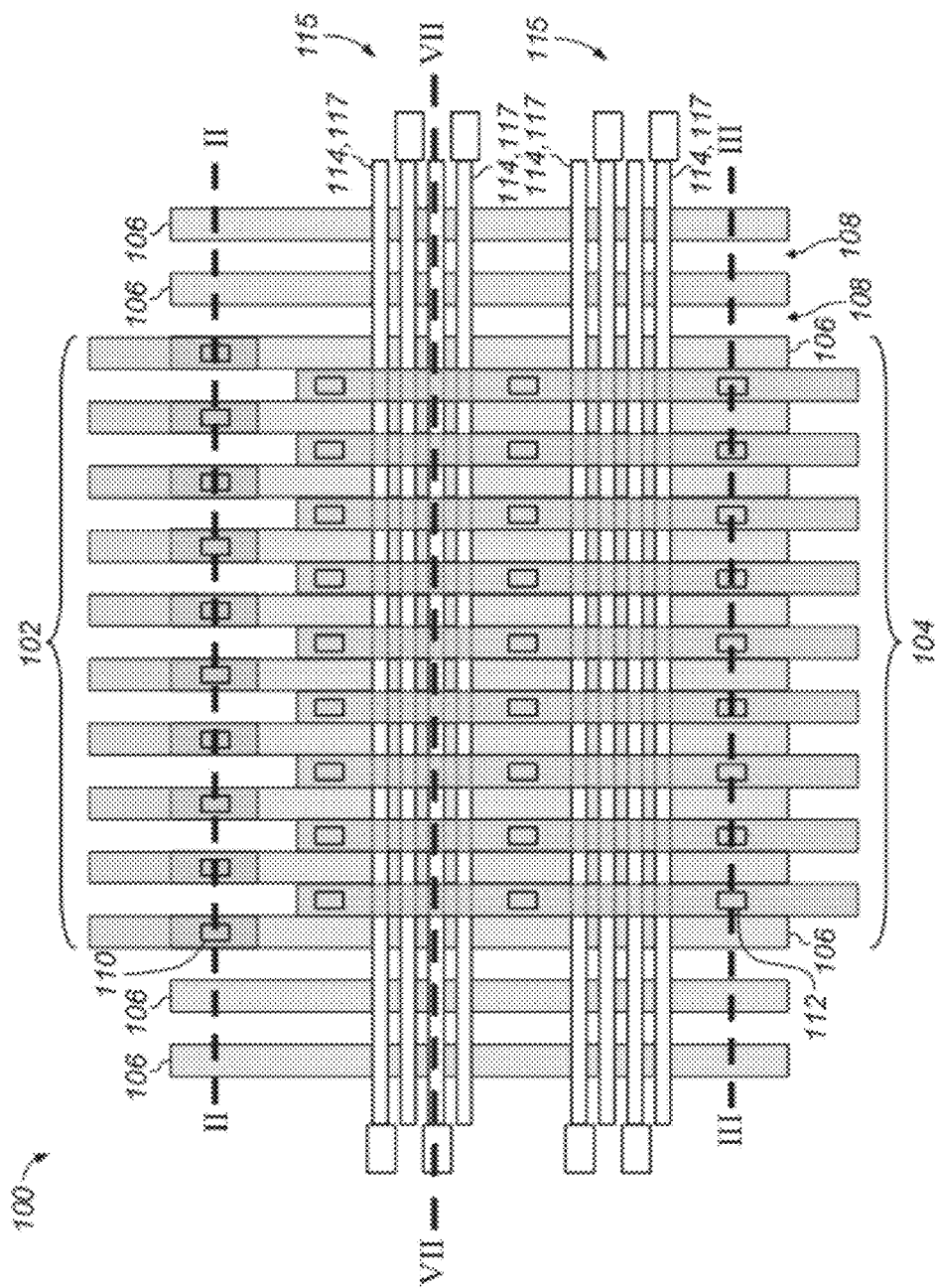
FIG. 1 shows a plan view of an exemplary layout of a portion of a nitride read only memory (NROM) memory array.

Referring to FIG. 1, a first embodiment involves a silicide approach to back-end pitch relaxation. FIG. 1 shows a plan view of an exemplary layout of a portion of a nitride read only memory (NROM) memory array 100, which includes a first plurality of bit lines 102 that extend to respective ones of a plurality of top bit line transistors (top BLT), and a second plurality of bit lines 104 that extend to respective ones of a plurality of bottom bit line transistors (bottom BLT). The first plurality of bit lines 102 extend in parallel with, and over, a plurality of upper buried diffusion implant (BDF) regions 106. The second plurality of bit lines 104 extend in parallel with, and over, a plurality of lower BDF regions 108. A first plurality of contacts 110, which constitute examples of vertical contact structures, extend vertically between respective ones of the first plurality of bit lines 102 and respective ones of the plurality of upper BDF regions 106. A second plurality of contacts 112, which also constitute examples of vertical contact structures, extend vertically between respective ones of the second plurality of bit lines 104 and respective ones of the plurality of lower BDF regions 108. The contacts 110 and 112 can be formed of a metal material, for example tungsten (W) or copper (Cu). In addition, while not shown in FIG. 1, it will be appreciated based on the following description and the views shown in FIGS. 2-9, that silicide contacts 118 also extend over and parallel to respective ones of the upper BDF regions 106. A plurality of gate structures 115, which include respective polygate structures 114 and word lines (WL) 117, extend across the memory array 100 between, and at least substantially perpendicular to, the bit lines 102 and 104 and the upper and lower BDF regions 106 and 108.

Figure 2:
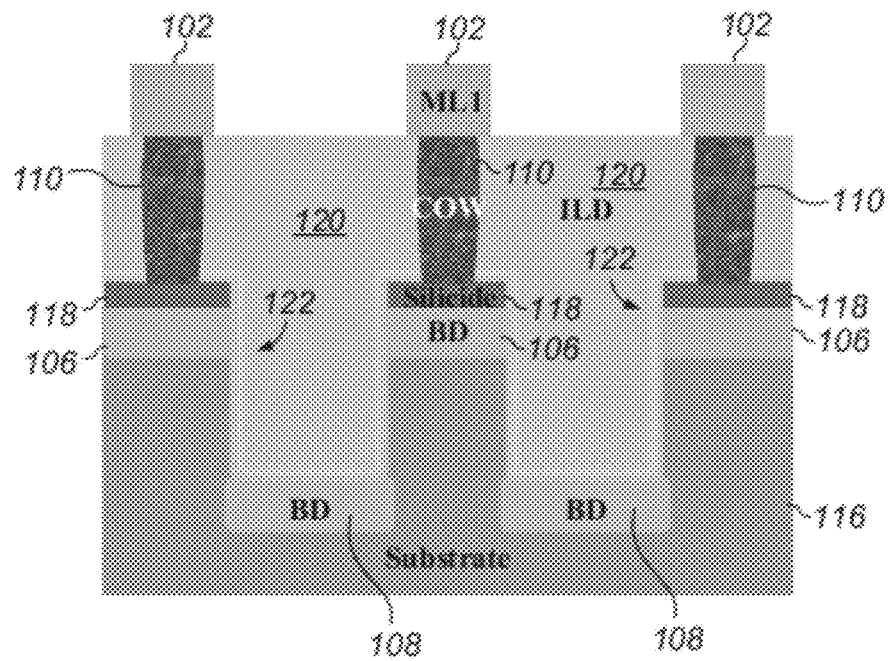
FIG. 2 shows a cross-sectional view of the memory array taken along a portion of section line II-II in FIG. 1.
Figure 3:
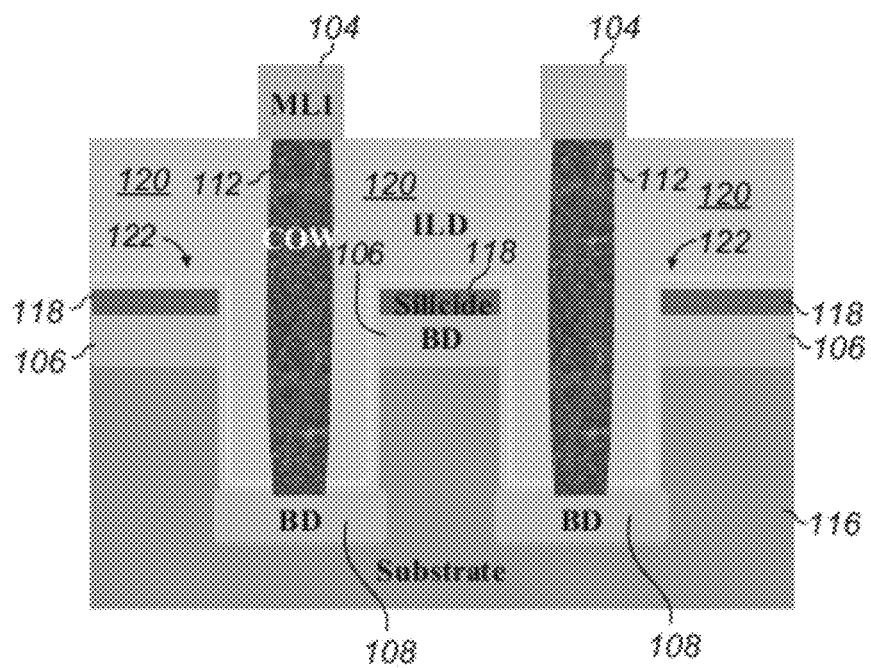
FIG. 3 shows a cross-sectional view of the memory array taken along a portion of section line III-III in FIG. 1.

FIG. 2 shows a cross-sectional view of the memory array 100 taken along a portion of section line II-II in FIG. 1, and FIG. 3 shows a cross-sectional view of the memory array 100 taken along a portion of section line III-III in FIG. 1. FIGS. 2 and 3 illustrate a substrate 116 with the upper BDF regions 106 and lower BDF regions 108 formed on the substrate 116. Silicide contacts 118 are formed above the upper BDF regions 106. The upper BDF regions 106 are in contact with respective contacts 110 via respective silicide contacts 118, and the lower BDF regions 108 are in contact with respective contacts 112. An inter-layer dielectric (ILD) region 120 is formed between each of the plurality of contacts 110 and between each of the plurality of contacts 112. An oxide-nitride-oxide (ONO) structure 122 extends between the upper and lower BDF regions 106 and 108, along sidewalls of vertical channels in the substrate 116. The ONO structure 122 can serve as a charge storage layer of a memory cell of the memory array 100.

Figure 4:
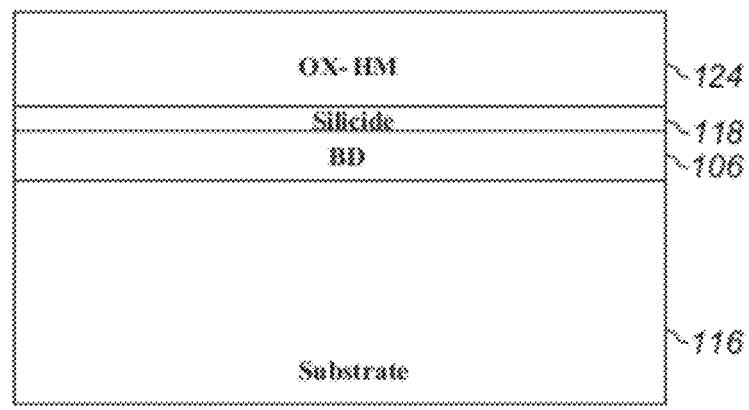
FIGS. 4-9 show structures at various stages in the formation of the memory array shown in FIGS. 1-3.
Figure 5:
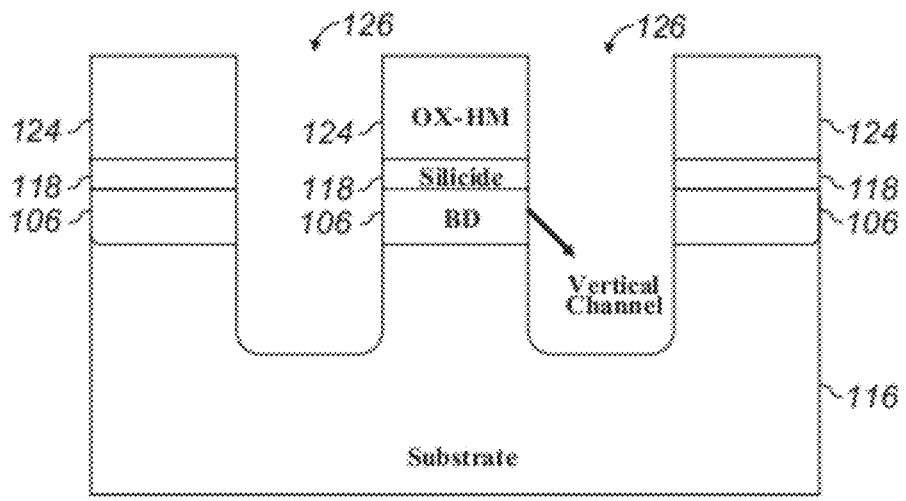
Figure 6:
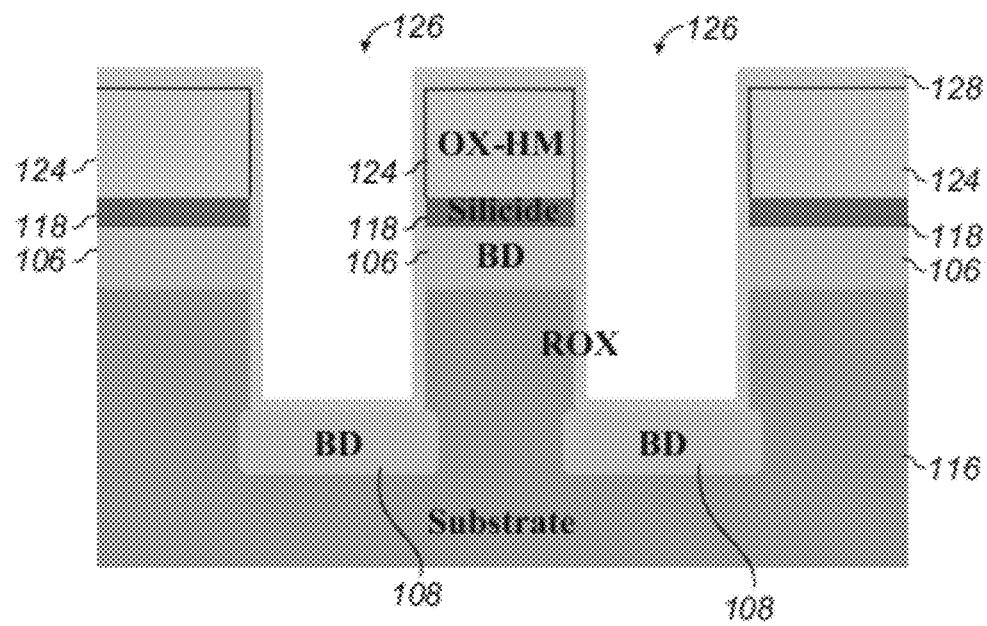

An embodiment of a process for forming the memory array structures shown in FIGS. 1-3 will now be described in connection with FIGS. 4-10. FIGS. 4-9 show intermediate structures in the formation of the memory array 100, and FIG. 10 shows a flowchart illustrating the present embodiment of a method for forming the memory array 100. Note that the intermediate structures shown in FIGS. 4-6 are the same for the final structures as viewed along any of the sectional views shown in FIGS. 7-9.

Referring to FIG. 4, a layer for forming the upper BDF region 106 is fabricated on the surface of the substrate 116.

FIG. 4 illustrates in a cross-sectional view a substrate 116 on which the memory array 100 is formed. Although not shown, semiconductor devices and other layers may be formed within or over the substrate 116. For example, logic transistors may be formed in the substrate 116 using conventional methods. Patterning of various structures can be achieved using known lithography processes, for example photolithography processes.

A BDF layer 106, portions of which will later become the upper BDF regions 106, is formed over the substrate 116, for example by ion implantation (IMP). Next, a silicide layer 118, portions of which will later become the silicide contacts 118, is formed over the BDF layer 106, for example by depositing a silicide material ($WSi_x$) according to known deposition processes, such as chemical vapor deposition (CVD), physical vapor deposition (PVD), thermal growth, or combinations thereof. Then a hard mask layer 124 is formed over the silicide layer 118. For example, the hard mask layer 124 can be an oxide material formed according to known deposition processes, such as chemical vapor deposition (CVD), physical vapor deposition (PVD), thermal growth, or combinations thereof.

Referring to FIG. 5, once the mask layer 124 is in place, a photolithography process can be used to pattern and form the vertical channels 126. The process of forming the vertical channels 126 can include a series of one or more etching processes. For example, in some embodiments, a Bottom Anti-Reflective Coating (BARC) can be formed in connecting with a selective etching process, thereby allowing for one or more self-aligning structures. As shown in FIG. 5, the etching includes etching through the hard mask layer 124, and to the substrate 116, so as to form the vertical channels 126.

Next, referring to FIG. 6, lower BDF regions 108 are formed over the substrate 116 in the portions of the substrate 116 exposed in the bottom of the vertical channels 126. The lower BDF regions 108 can be formed, for example, by ion implantation (IMP). Before the formation of the lower BDF regions 108 an oxide layer 128 is formed, for example involving a radical oxidation (ROX) process, to protect the vertical channel 126.

Figure 7:
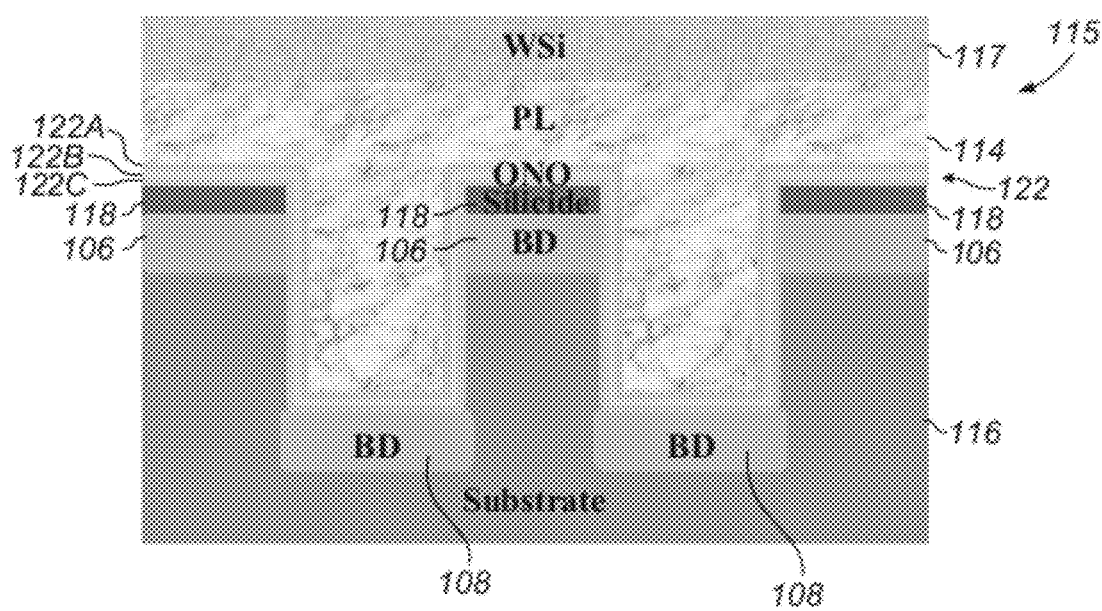

FIG. 7 shows a cross-sectional view of the memory array 100 taken along a portion of section line VII-VII in FIG. 1. Compared to the structure shown in FIG. 6, in the view shown in FIG. 7, the ONO structure 122 and the gate structure 115, including polygate structure 114 and word line (WL) 117, have been formed. First, the excess oxide material, such as that of the mask layer 124 and oxide layer 128, are removed using an oxide CLN (cleaning) process. The ONO structure 122 is then formed over the silicide contacts 118, along the sidewalls of the vertical channels 126, and over the lower BDF regions 108. The ONO structure 122 can be formed by known methods to include a lower oxide layer 122C, a silicone nitride layer 122B formed over the lower oxide layer 122C, and an upper oxide layer 122A formed over the silicon nitride layer 122B. A thermal oxidation process can be used to form each of the lower and upper oxide layers 122C and 122A, while a deposition process, for example a CVD process, can be used to form the silicon nitride layer 122B.

Also, FIG. 7 shows the gate structure 115, including the polygate structure 114, which is formed over the ONO structure 122, and the word line (WL) 117, which is formed over the polygate structure 114. The polygate structure 114 includes polysilicon material, while the word line (WL) 117 includes metal material, for example WSi, material. As shown in FIG. 10, the process of forming gate structure 115, including the polygate structure 114 and the word lines (WL) 117, can include a series of deposition and photolithography processes, including, for example, tetraethylorthosilicate (TEOS) deposition and polysilicon hard mask (PL HM) deposition for defining and photolithography/etching of the material to form the polygate lines 114 and word lines (WL) 117.

Figure 8:
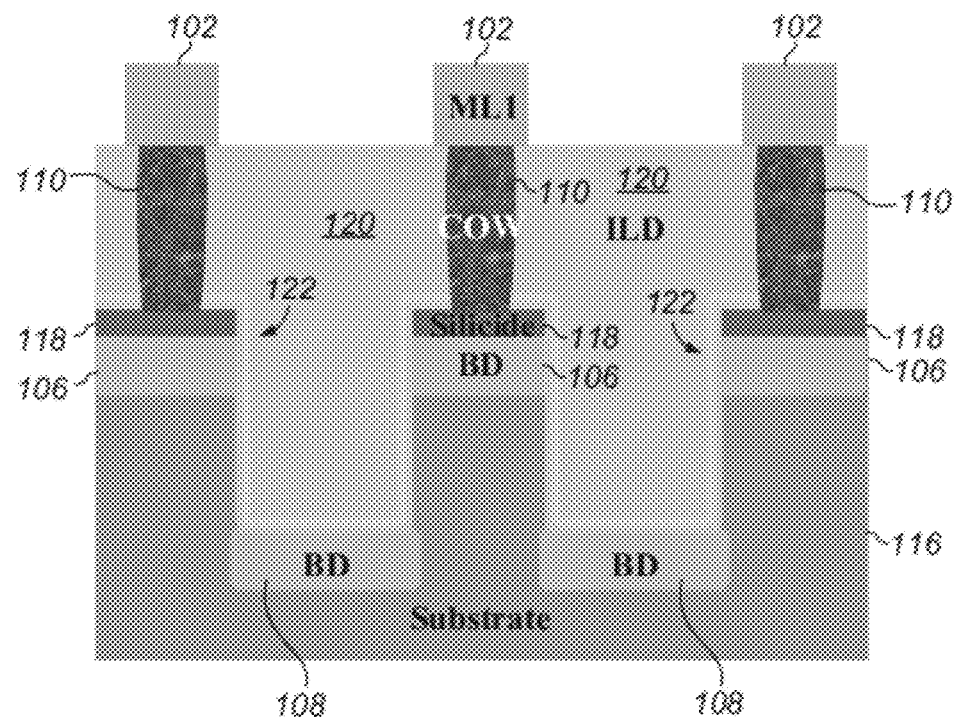
Figure 9:
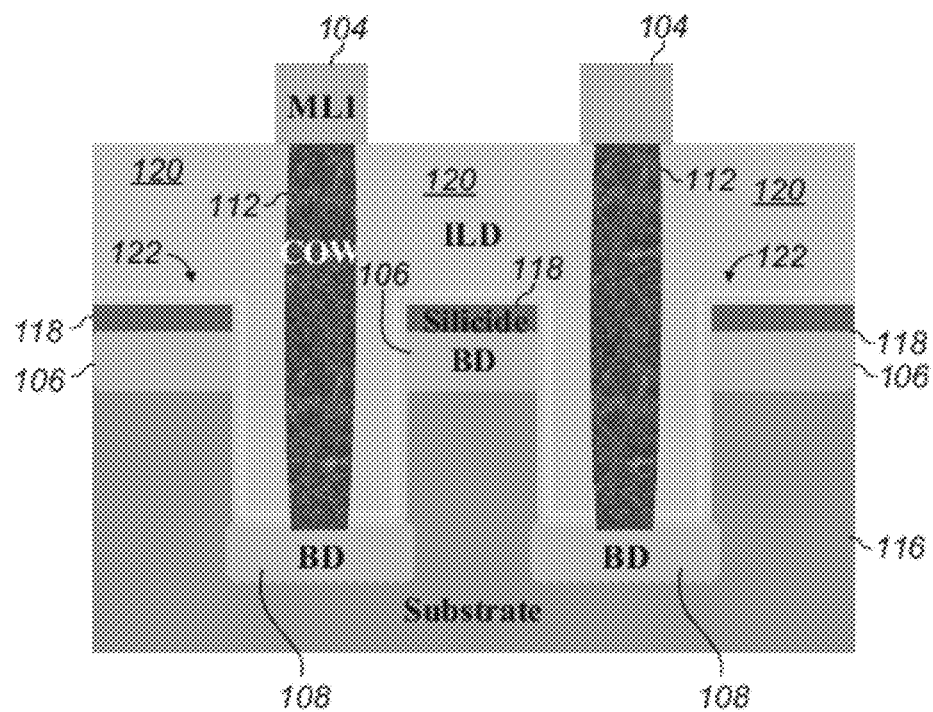
Figure 10:
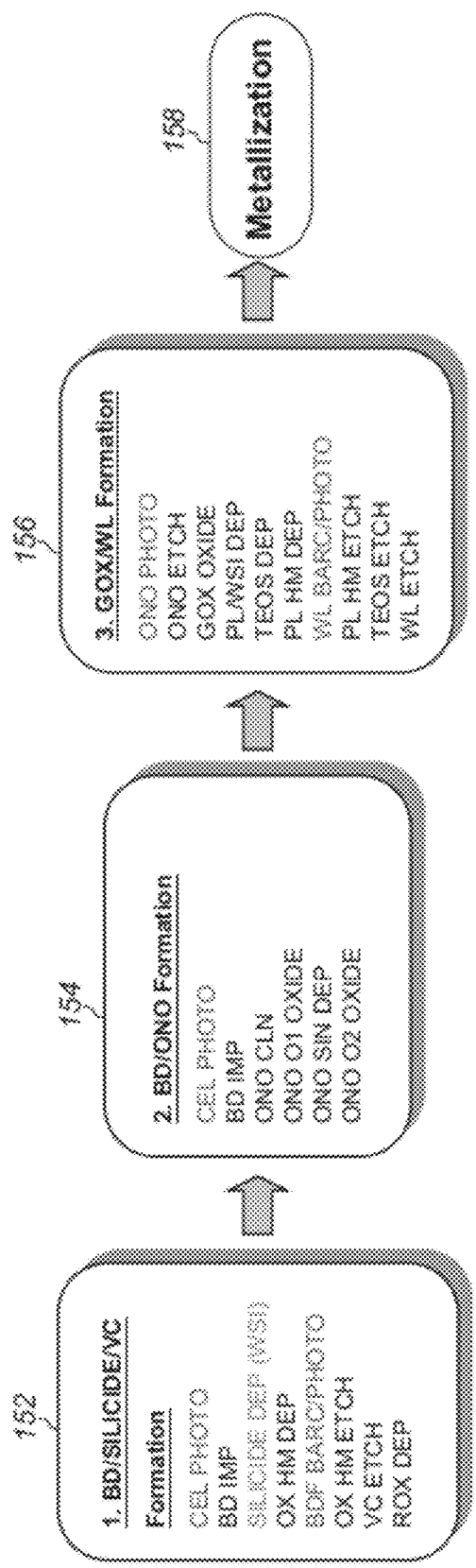
FIG. 10 shows a flowchart illustrating an embodiment of a method for forming the memory array shown in FIGS. 1-9.

Then, the ILD region 120, the contacts 110, 112, and bit lines 102, 104 can be formed to achieve the structures shown in FIGS. 8 and 9, which correspond to the cross-sectional views shown in FIGS. 2 and 3, respectively. It will be appreciated that one or more photolithography processes can be employed to achieve the desired arrangement of the ILD region 120, the contacts 110, 112, and bit lines 102, 104. For example, photolithography and etching can be used to remove certain portions of the ILD region 120 and the ONO structure 122 so as to allow the contacts 110 to be in direct contact with the silicide contacts 118, and also so as to allow the contacts 112 to be in direct contact with the lower BDF regions 108.

FIGS. 8 and 9 show the completed structures along a portion of section lines II-II and III-III of FIG. 1, respectively. Metallization processes can then be employed to form the ILD 120, contacts 110, 112 and bit lines 102, 104 so as to achieve the desired memory array 100 structure, for example as shown in FIGS. 1-3.

FIG. 10 shows a flowchart that illustrates a summary of an embodiment of a manufacturing process that can be followed for manufacturing the memory array 100 as shown in FIGS. 1-9. Block 152 shows an example of manufacturing processes that can be followed for formation of the structure shown in FIGS. 4-5, including formation of the upper BDF regions 106, the silicide contacts 118, and the vertical channels 126. Block 154 shows an example of manufacturing processes that can be followed for formation of the structure shown in FIG. 6 and some of the structure shown in FIG. 7, including formation of the lower BDF regions 108 and the ONO structure 122. Block 156 shows an example of manufacturing processes that can be followed for formation of the structure shown in FIG. 7, including formation of the gate structure 115, which includes the polygate structure 114 and the word lines (WL) 117. After the processing of block 156, metallization processes can be performed as indicated at block 158 to complete the structure shown in FIGS. 1-3. Alternative processes can be used, for example for alternative embodiments involving other types of memory devices.

Figure 11:
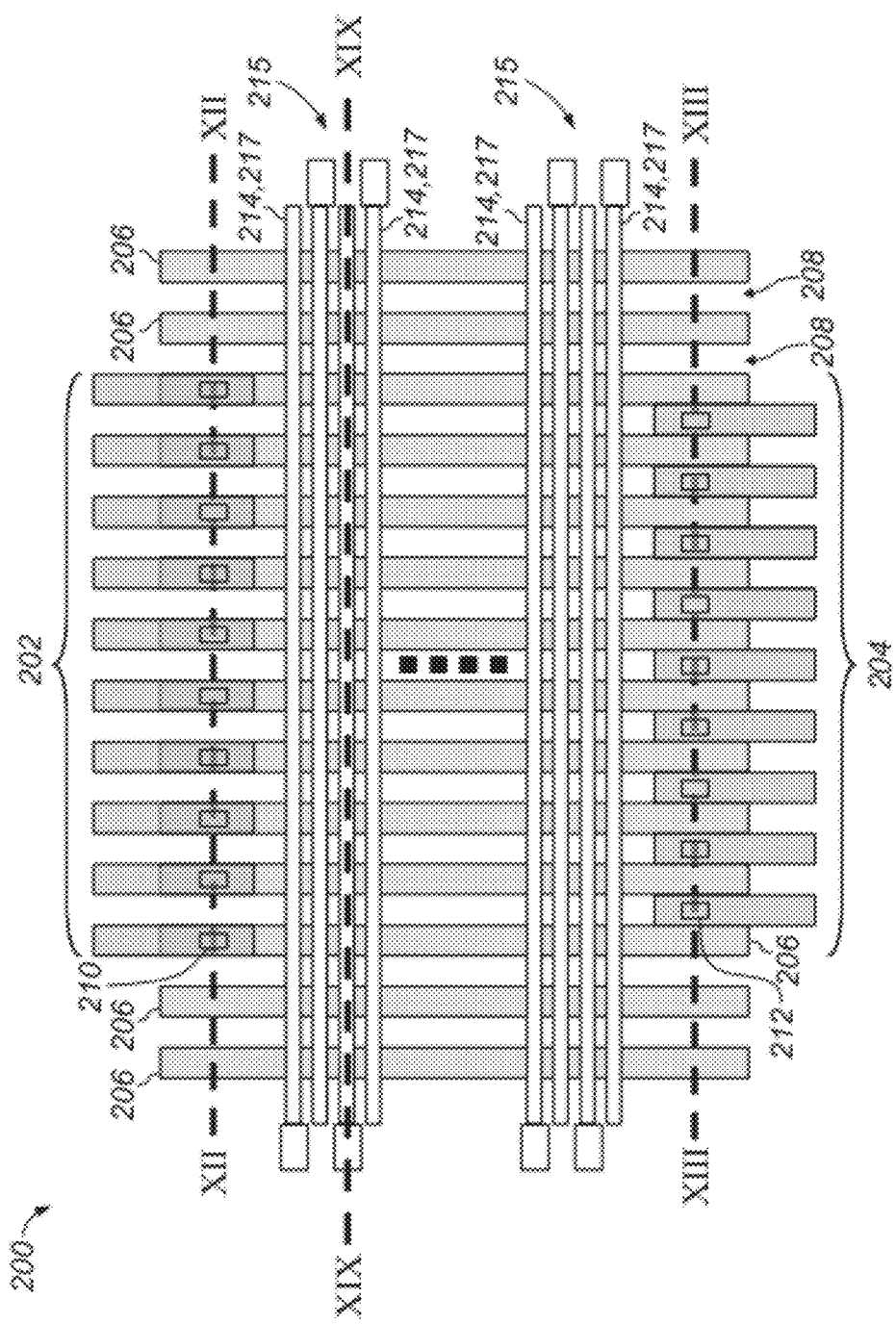
FIG. 11 shows a plan view of an alternative exemplary layout of a portion of a nitride read only memory (NROM) memory array.

Referring next to FIG. 11, a second embodiment involves a salicide approach to back-end pitch relaxation. FIG. 11 shows a plan view of an exemplary layout of a portion of the memory array 200, which includes a first plurality of bit lines 202 that extend to respective ones of a plurality of top bit line transistors (top BLT), and a second plurality of bit lines 204 that extend to respective ones of a plurality of bottom bit line transistors (bottom BLT). The first plurality of bit lines 202 extend in parallel with, and over, a plurality of upper buried diffusion implant (BDF) regions 206. The second plurality of bit lines 204 extend in parallel with, and over, a plurality of lower BDF regions 208. A first plurality of contacts 210, which constitute examples of vertical contact structures, extend vertically between respective ones of the first plurality of bit lines 202 and respective ones of the plurality of upper BDF regions 206. A second plurality of contacts 212, which also constitute examples of vertical contact structures, extend vertically between respective ones of the second plurality of bit lines 204 and respective ones of the plurality of lower BDF regions 208. The contacts 210 and 212 can be formed of a metal material, for example tungsten (W) or copper (Cu). In addition, while not shown in FIG. 11, it will be appreciated based on the following description and the views shown in FIGS. 12-21, that salicide contacts 218 also extend over and parallel to respective ones of the upper and lower BDF regions 206 and 208. A plurality of gate structures 215, which include respective polygate structures 214 and word lines (WL) 217, extend across the memory array 200 between, and at least substantially perpendicular to, the bit lines 202 and 204 and the upper and lower BDF regions 206 and 208.

Figure 12:
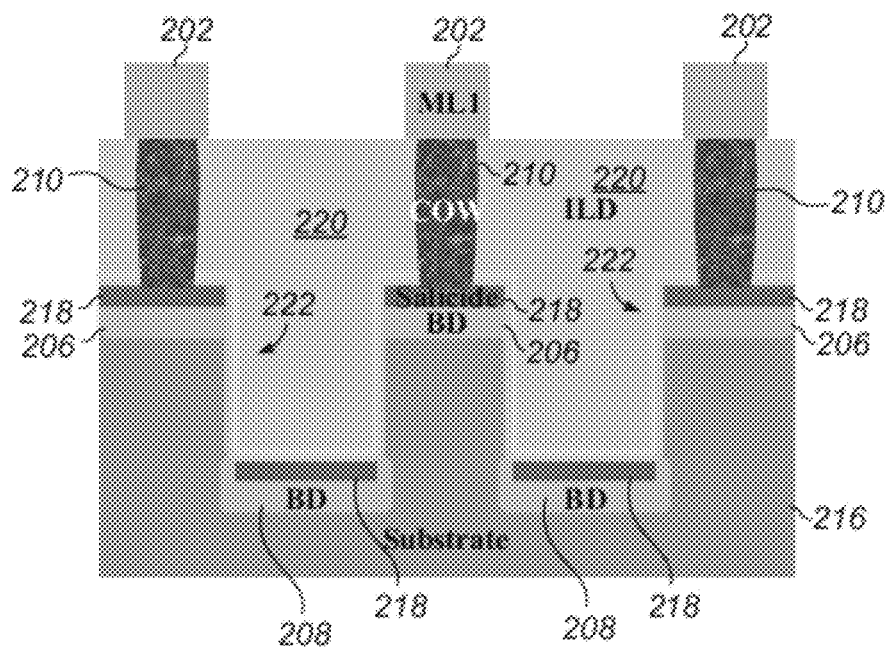
FIG. 12 shows a cross-sectional view of the memory array taken along a portion of section line XII-XII in FIG. 11.
Figure 13:
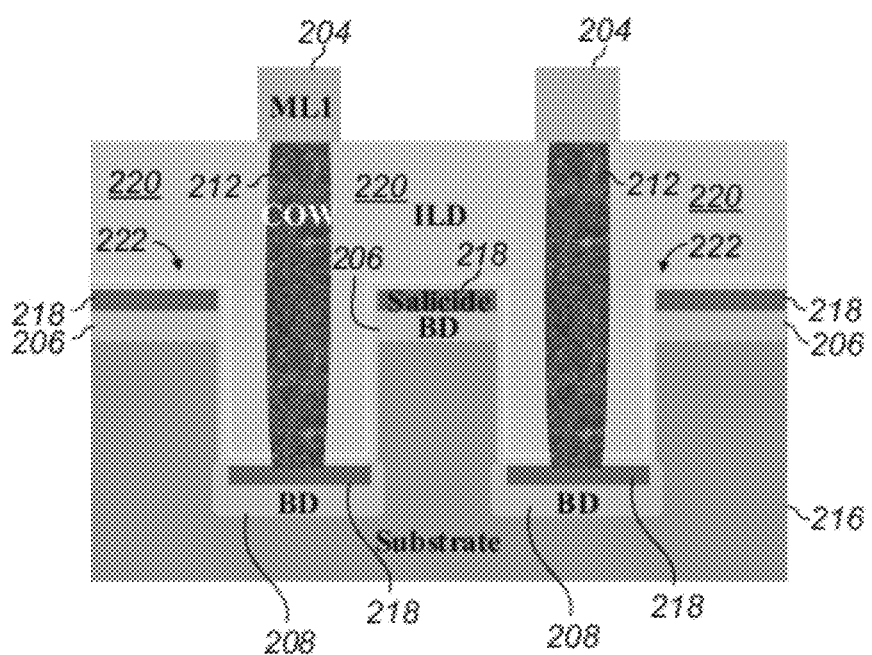
FIG. 13 shows a cross-sectional view of the memory array taken along a portion of section line XIII-XIII in FIG. 11.

FIG. 12 shows a cross-sectional view of the memory array 200 taken along a portion of section line XII-XII in FIG. 11, and FIG. 13 shows a cross-sectional view of the memory array 200 taken along a portion of section line XIII-XIII in FIG. 11. FIGS. 12 and 13 illustrate a substrate 216 with the upper BDF regions 206 and lower BDF regions 208 formed on the substrate 216. Salicide contacts 218 are formed above the upper BDF regions 206 and also above the lower BDF regions 208. The upper BDF regions 206 are in contact with respective contacts 210 via respective salicide contacts 218, and the lower BDF regions 208 are in contact with respective contacts 212 via respective salicide contacts 218. An interlayer dielectric (ILD) region 220 is formed between each of the plurality of contacts 210 and between each of the plurality of contacts 212. An oxide-nitride-oxide (ONO) structure 222 extends between the upper and lower BDF regions 206 and 208, along sidewalls of vertical channels in the substrate 216. The ONO structure 222 can serve as a charge storage layer of a memory cell of the memory array 200.

An embodiment of a process for forming the memory array structures shown in FIGS. 11-13 will now be described in connection with FIGS. 14-22. FIGS. 14-21 show intermediate structures in the formation of the memory array 200, and FIG. 22 shows a flowchart illustrating the present embodiment of a method for forming the memory array 200. Note that the intermediate structures shown in FIGS. 14-18 are the same for the final structures as viewed along any of the sectional views shown in FIGS. 19-21.

Figure 14:
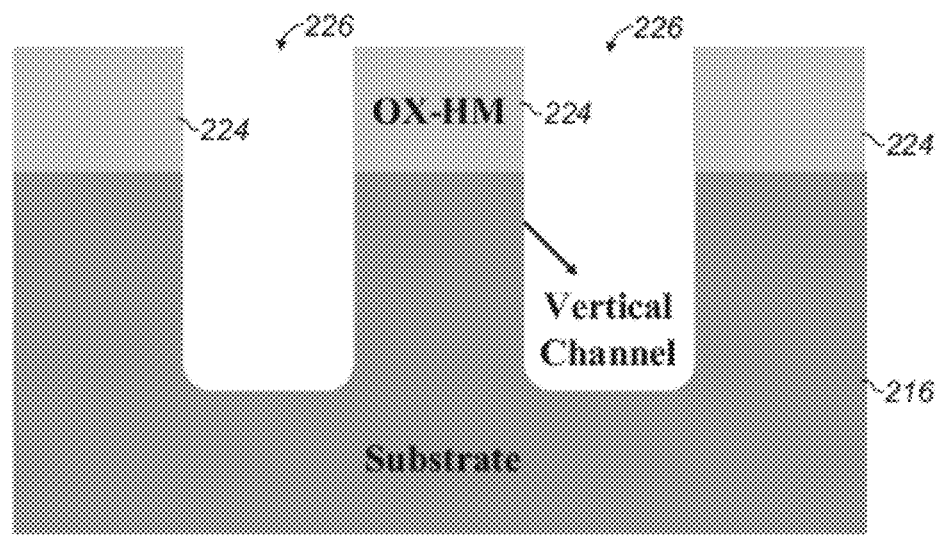
FIGS. 14-21 show structures at various stages in the formation of the memory array shown in FIGS. 11-13.
Figure 15:
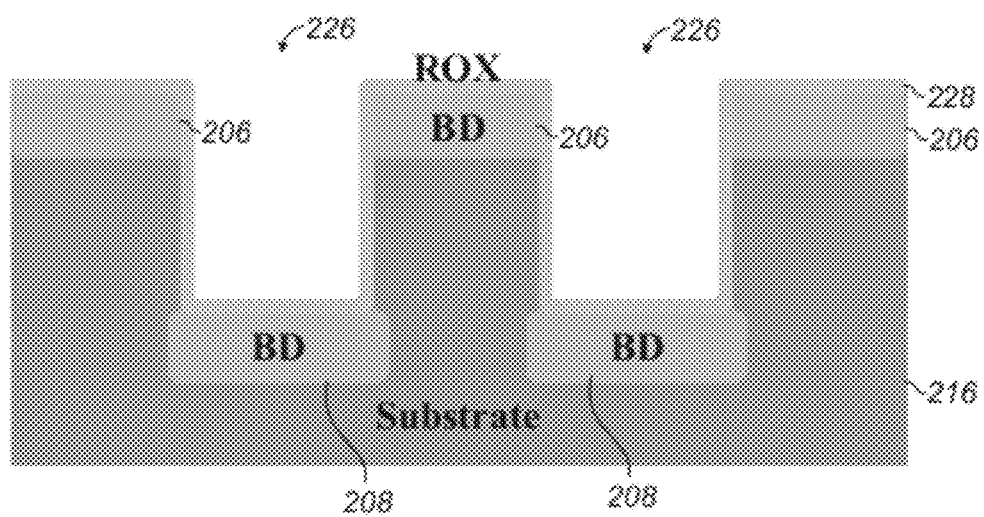

Referring to FIG. 14, a hard mask layer 224 is formed over the substrate 216. For example, the hard mask layer 224 can be an oxide material formed according to known deposition processes, such as chemical vapor deposition (CVD), physical vapor deposition (PVD), thermal growth, or combinations thereof. Once the mask layer 224 is in place, a photolithography process can be used to pattern and form the vertical channels 226. The process of forming the vertical channels 226 can include a series of one or more etching processes. For example, in some embodiments, a Bottom Anti-Reflective Coating (BARC) can be formed in connecting with a selective etching process, thereby allowing for one or more self-aligning structures.

Next, before the formation of the upper BDF regions 206 and lower BDF regions 208, an oxide layer 228 is formed, for example involving a radical oxidation (ROX) process, to protect the vertical channel 226. Before forming the BDF regions 206, 208 and oxide layer 228, excess material of the mask layer 224 can be removed, for example using an oxide CLN (cleaning) process. The oxide layer 228 is then formed, followed by formation of the upper BDF regions 206 and the lower BDF regions 208.

Figure 16:
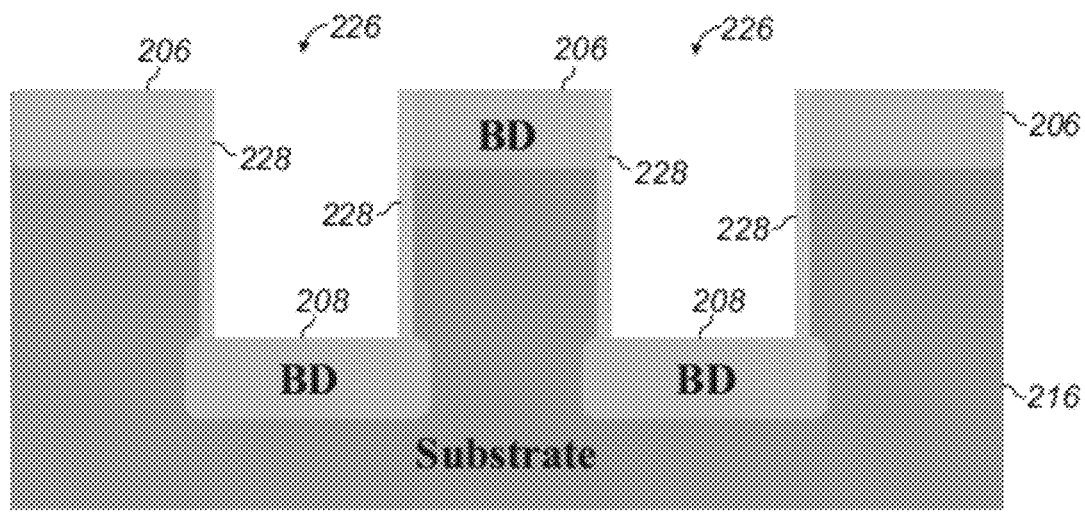

FIG. 16 shows the results of an etching process to remove portions of the oxide layer 228 from over the upper BDF regions 206, and also from over the lower BDF regions 208. Portions of the oxide layer 228 remain along the sidewalls of the vertical channels 226.

Figure 17:
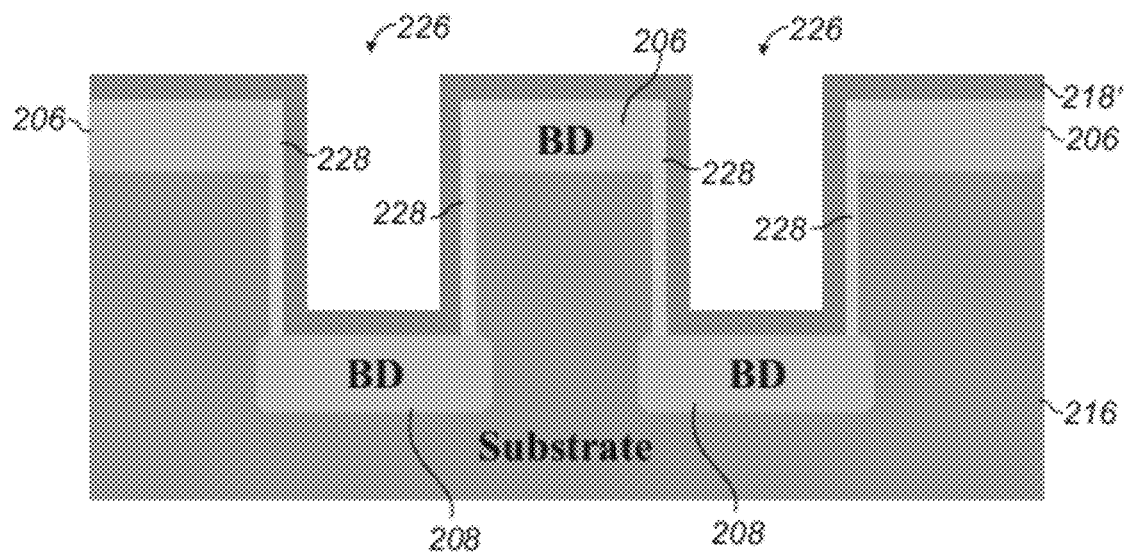

Next, as shown in FIG. 17, a metal layer 218', portions of which will later become the salicide contacts 218, is formed over the lower BDF regions 208, the oxide layer 228 along the sidewalls of the vertical channels 226, and over the upper BDF regions 206. The metal layer 218' can be formed, for example, by depositing a salicide precursor material such as nickel (Ni) or cobalt (Co) according to known deposition processes, such as chemical vapor deposition (CVD), physical vapor deposition (PVD), thermal growth, or combinations thereof.

Figure 18:
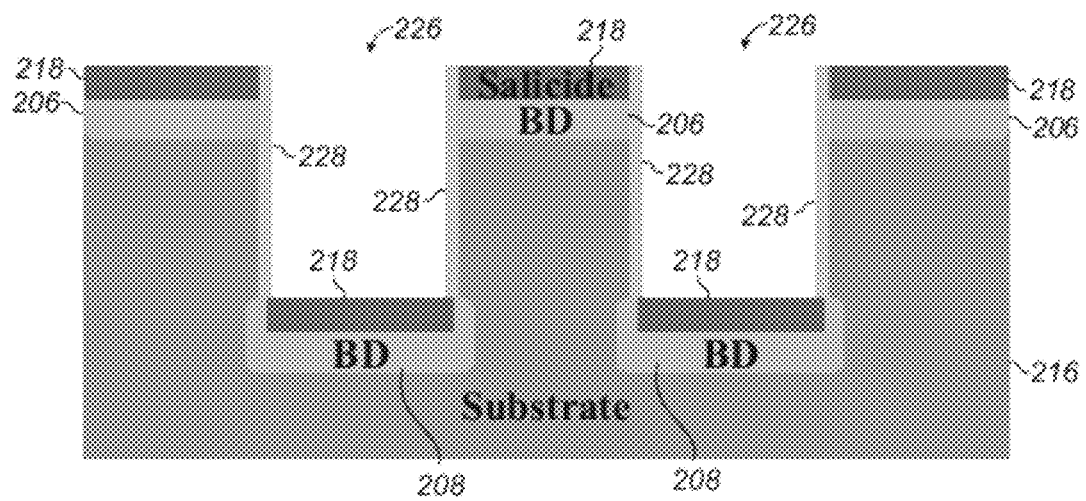

FIG. 18 shows the results of the removal of portions of the metal layer 218', which can also include rapid thermal processing (RTP). Portions of the metal layer 218' adjacent to the upper BDF regions 206 and lower BDF regions 208 will react with silicon material in the BDF regions 206 and 208, thereby resulting in self-aligning formation of the salicide contacts 218 over the upper BDF regions 206 and over the lower BDF regions 208.

Figure 19:
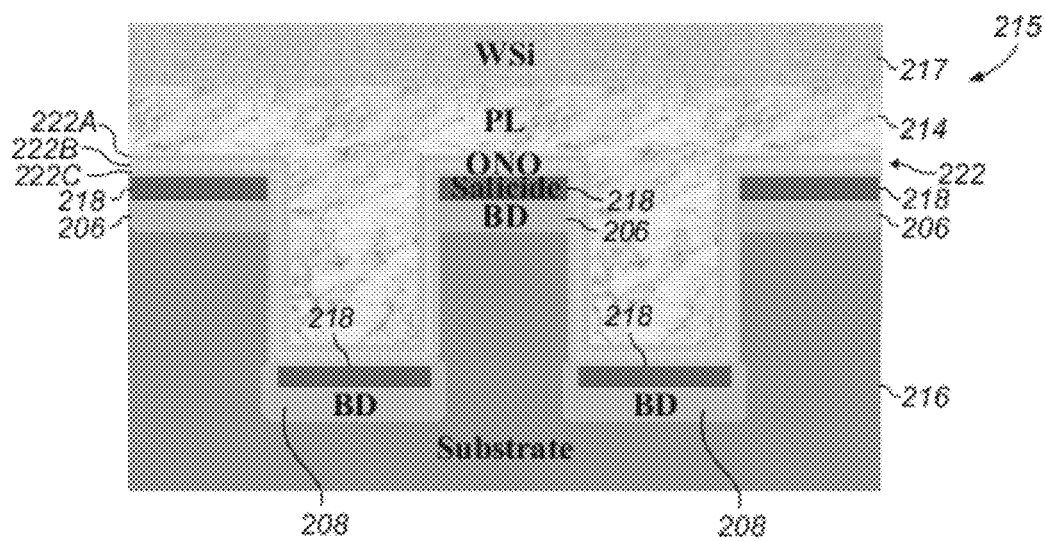

FIG. 19 shows a cross-sectional view of the memory array 200 shown in FIG. 11 taken along a portion of section line XIX-XIX in FIG. 11. Compared to the structure shown in FIG. 18, in the view shown in FIG. 19, the ONO structure 222 and the gate structure 215, including polygate structure 214 and word line (WL) 217, have been formed. First, the oxide material of the oxide layer 228 is removed using an oxide CLN (cleaning) process. The ONO structure 222 is then formed over the salicide contacts 218 (over both the upper and lower BDF regions 206 and 208) and along the sidewalls of the vertical channels 226. The ONO structure 222 can be formed by known methods to include a lower oxide layer 222C, a silicone nitride layer 222B formed over the lower oxide layer 222C, and an upper oxide layer 222A formed over the silicon nitride layer 222B. A thermal oxidation process can be used to form each of the lower and upper oxide layers 222C and 222A, while a deposition process, for example a CVD process, can be used to form the silicon nitride layer 222B.

Also, FIG. 19 shows the gate structure 215, including the polygate structure 214, which is formed over the ONO structure 222, and the word line (WL) 217, which is formed over the polygate structure 214. The polygate structure 214 includes polysilicon material, while the word line (WL) 217 includes metal material, for example WSi, material. As shown in FIG. 22, the process of forming gate structure 215, including the polygate structure 214 and the word lines (WL) 217, can include a series of deposition and photolithography processes, including, for example, tetraethylorthosilicate (TEOS) deposition and polysilicon hard mask (PL HM) deposition for defining and photolithography/etching of the material to form the polygate lines 214 and word lines (WL) 217.

Figure 20:
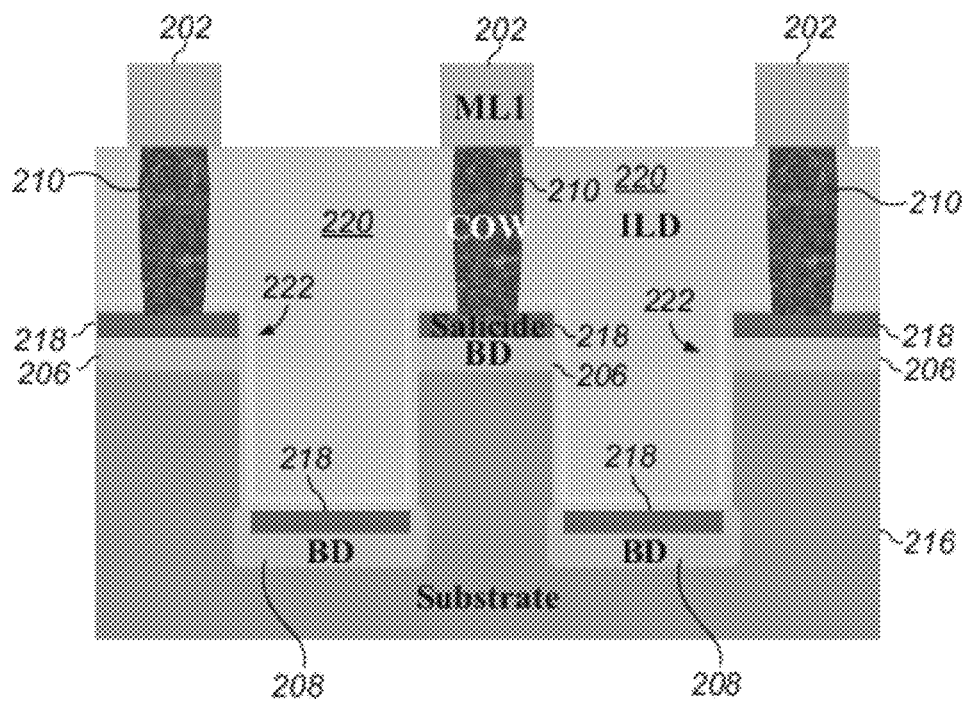
Figure 21:
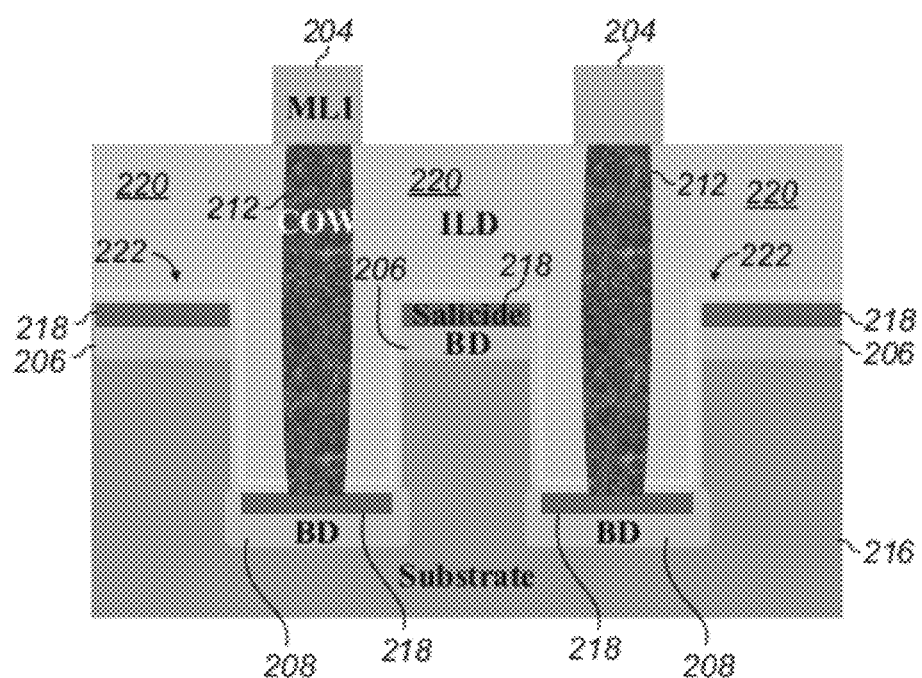
Figure 22:
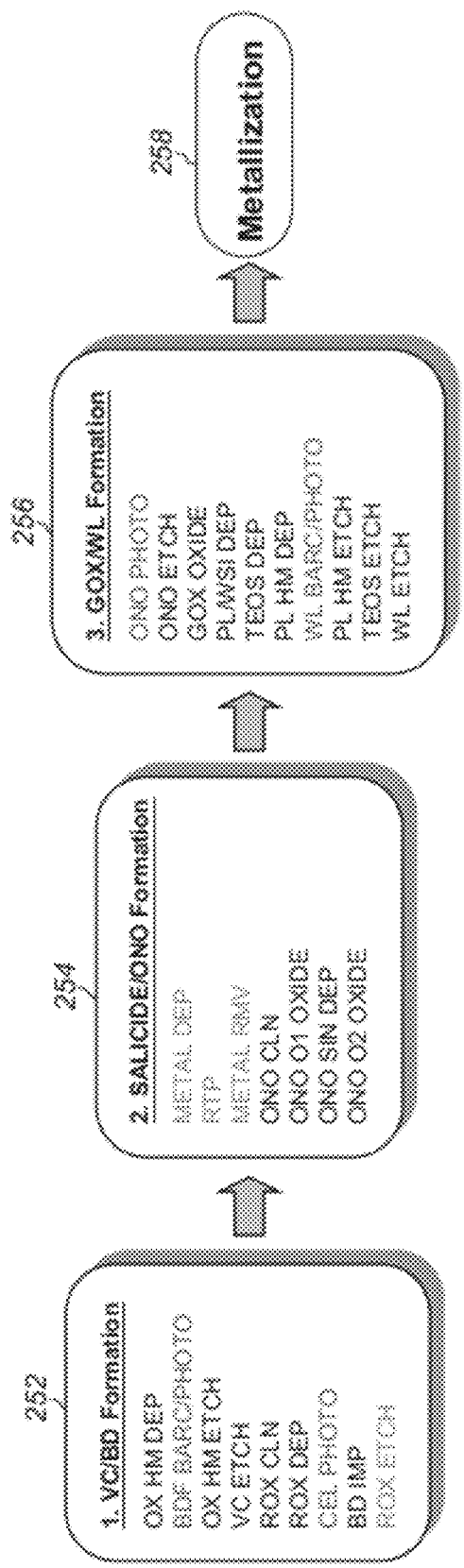
FIG. 22 shows a flowchart illustrating an embodiment of a method for forming the memory array shown in FIGS. 11-21.

Then, the ILD region 220, the contacts 210, 212, and bit lines 202, 204 can be formed to achieve the structures shown in FIGS. 20 and 21, which correspond to the cross-sectional views shown in FIGS. 12 and 13, respectively. It will be appreciated that one or more photolithography processes can be employed to achieve the desired arrangement of the ILD region 220, the contacts 210, 212, and bit lines 202, 204. For example, photolithography and etching can be used to remove certain portions of the ILD region 220 and the ONO structure 222 so as to allow the contacts 210 to be in direct contact with the salicide contacts 218 over the upper BDF regions 206, and also so as to allow the contacts 212 to be in direct contact with the salicide contacts 218 over the lower BDF regions 208.

FIGS. 20 and 21 show the completed structures along a portion of section lines XII-XII and XIII-XIII of FIG. 11, respectively. Metallization processes can then be employed to form the ILD 220, contacts 210, 212 and bit lines 202, 204 so as to achieve the desired memory array 200 structure, for example as shown in FIGS. 11-13.

FIG. 22 shows a flowchart that illustrates a summary of an embodiment of a manufacturing process that can be followed for manufacturing the memory array 200 as shown in FIGS. 11-21. Block 252 shows an example of manufacturing processes that can be followed for formation of the structures shown in FIGS. 14-16, including formation of the upper BDF regions 206, the lower BDF regions 208, and the vertical channels 226. Block 254 shows an example of manufacturing processes that can be followed for formation of the structures shown in FIGS. 17 and 18, as well as some of the structure shown in FIG. 19, including formation of the salicide contacts 218 and the ONO structure 222. Block 256 shows an example of manufacturing processes that can be followed for formation of the structure shown in FIG. 19, including formation of the polygate structure 214. After the processing of block 256, metallization processes can be performed as indicated at block 258 to complete the structure shown in FIGS. 11-13. Alternative processes can be used, for example for alternative embodiments involving other types of memory devices.

Thus, the present disclosure provides for the manufacturing of a semiconductor integrated circuit device in such a way that allows for improved scaling down of various back-end structures, which can include contacts and other metal interconnection structures. The resulting structures can include at least one of a silicide film, for example $Wsi_x$, and a salicide film, for example CoSi and/or NiSi, above a buried diffusion (BD) layer. While the disclosed embodiments are presented in connection with an NROM memory device, alternative embodiments can involve other types of memory devices. For example, the present disclosure also applies to buried-diffusion (BD) type memory devices. For example, an alternative embodiment can include a BD type memory device comprising Nbit memory cells with planar channels, vertical channels, and/or vertical channels with physical isolation structures. Also, alternative embodiments can include a Bandgap Engineered Silicon-Oxide-Nitride-Oxide-Silicon (BE-SONOS) or nanocrystal layer in place of the ONO structure 222.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor integrated circuit device, comprising:
   a semiconductor substrate;
   a first buried diffusion region above the semiconductor substrate;
   a first contact layer above the first buried diffusion region, the first contact layer comprising salicide material, wherein the salicide material comprises at least one of cobalt and nickel; and
   a memory gate structure formed over at least a portion of the first contact layer.

2. The semiconductor integrated circuit of claim 1, wherein the first contact layer comprises silicide material, and wherein the silicide material comprises tungsten.

3. The semiconductor integrated circuit of claim 1, wherein the first contact layer is connected to a bit line via a vertical contact structure.

4. The semiconductor integrated circuit of claim 1, further comprising a second buried diffusion region and a charge storage layer, wherein the charge storage layer extends between the first and second buried diffusion regions.

5. The semiconductor integrated circuit of claim 4, wherein the charge storage layer is on a sidewall of a vertical channel.

6. The semiconductor integrated circuit of claim 4, further comprising a second contact layer above the second buried diffusion region.

7. The semiconductor integrated circuit of claim 6, wherein the charge storage layer extends between the first and second contact layers.

8. The semiconductor integrated circuit of claim 6, wherein the second contact layer comprises a salicide material.

9. The semiconductor integrated circuit of claim 8, wherein the salicide material comprises at least one of cobalt and nickel.

10. A method for forming a semiconductor integrated circuit, the method comprising:
    forming a first buried diffusion region over a semiconductor substrate;
    forming a first contact layer above the first buried diffusion region, the first contact layer comprising salicide material, wherein the salicide material comprises at least one of cobalt and nickel; and
    forming a memory gate structure over at least a portion of the first contact layer.

11. The method of claim 10, wherein the first contact layer comprises silicide material, and wherein the silicide material comprises tungsten.

12. The method of claim 10, further comprising:
    forming a vertical contact structure connected to the first contact layer; and
    forming a bit line connected to the first contact layer via the vertical contact structure.

13. The method of claim 10, further comprising forming a second buried diffusion region and forming a charge storage layer, wherein the charge storage layer extends between the first and second buried diffusion regions.

14. The method of claim 13, wherein the charge storage layer is on a sidewall of a vertical channel.

15. The method of claim 13, further comprising forming a second contact layer above the second buried diffusion region.

16. The method of claim 15, wherein the charge storage layer extends between the first and second contact layers.

17. The method of claim 15, wherein the second contact layer comprises a salicide material.

18. The method of claim 17, wherein the salicide material comprises at least one of cobalt and nickel.

\* \* \* \* \*